US010468179B2

(12) United States Patent
Mika

(10) Patent No.: US 10,468,179 B2
(45) Date of Patent: Nov. 5, 2019

(54) ACTIVE TWISTED FIGURE '8' INDUCTOR

(71) Applicant: Integrated Device Technology, Inc., San Jose, CA (US)

(72) Inventor: Benedykt Mika, Chandler, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 35 days.

(21) Appl. No.: 15/467,217

(22) Filed: Mar. 23, 2017

(65) Prior Publication Data

US 2018/0277301 A1 Sep. 27, 2018

(51) Int. Cl.
  *H01F 27/40* (2006.01)
  *H03B 5/12* (2006.01)
  *H03B 27/00* (2006.01)
  *H01F 21/12* (2006.01)
  *H01F 27/28* (2006.01)
  *H01F 17/00* (2006.01)

(52) U.S. Cl.
  CPC .............. *H01F 27/40* (2013.01); *H01F 21/12* (2013.01); *H03B 5/124* (2013.01); *H03B 5/1212* (2013.01); *H03B 5/1228* (2013.01); *H03B 27/00* (2013.01); *H01F 27/2823* (2013.01); *H01F 2017/0073* (2013.01); *H01F 2021/125* (2013.01)

(58) Field of Classification Search
  CPC ............................. H01F 27/40; H01F 27/2823
  USPC .................................. 336/200, 225, 226, 232
  See application file for complete search history.

(56) References Cited

U.S. PATENT DOCUMENTS

| 5,289,121 A * | 2/1994 | Kajola ................. G01R 33/022 324/248 |
| 2006/0226943 A1* | 10/2006 | Marques ............. H01F 17/0006 335/285 |
| 2008/0150668 A1* | 6/2008 | Gabara ..................... G06F 1/10 336/200 |
| 2013/0082793 A1* | 4/2013 | Eldredge .................. H03B 5/08 331/167 |
| 2013/0141203 A1* | 6/2013 | Yoon .................... H01L 23/5227 336/170 |
| 2018/0190424 A1* | 7/2018 | Caffee ..................... H01F 27/34 |

* cited by examiner

*Primary Examiner* — Tszfung J Chan
(74) *Attorney, Agent, or Firm* — Haynes and Boone, LLP

(57) ABSTRACT

An inductor is disclosed that includes an arrangement of lobes, each of the lobes in the arrangement of lobes including a generator, the arrangement of lobes interconnected such that, when currents are provided by each generator in the arrangement of lobes, each lobe in the arrangement of lobes produces a magnetic field with a defined polarity relative to the arrangement of lobes. When the arrangement of lobes are appropriately interconnected, the magnetic field from the arrangement of lobes can be canceled.

18 Claims, 5 Drawing Sheets

ACTIVE TWISTED FIGURE '8' INDUCTOR

TECHNICAL FIELD

Embodiments of the present invention are related to RF applications and, in particular, to an active twisted figure '8' inductor for RF applications.

DISCUSSION OF RELATED ART

Parasitic magnetic coupling is a primary design challenge in integrated system employing integrated inductors, which are utilized in virtually all modern integrated circuits from analog intensive finite impulse response (FIR) filters to voltage controlled oscillators (VCOs). Although there are many differently shaped inductors structures that attempt to minimize the magnetic sensitivity of the circuit in which they are embedded, the figure '8' shaped topology is one of the most popular. Although this topology exhibits very good coupling reduction (often between 40 and −70 dB), their electrical performance significantly deteriorated, which makes these topologies less attractive for high-end VCO applications.

Therefore, there is a need to develop better inductor topologies for use in RF integrated systems.

SUMMARY

Embodiments of the present disclosure includes an inductor. The inductor can include a plurality of lobes arranged relative to one another; a plurality of generators, each of the generators coupled to a corresponding one of the plurality of lobes; and interconnects coupled between the plurality of lobes such that magnetic fields generated in each of the lobes has an arranged polarity relative to the other lobes.

A method of forming an inductor according to some embodiments includes providing an arrangement of lobes, each of the lobes in the arrangement of lobes including a generator; and interconnecting the arrangement of lobes such that, when currents are provided by each generator in the arrangement of lobes, each lobe in the arrangement of lobes produces a magnetic field with a defined polarity relative to the arrangement of lobes.

Additional aspects, features, and advantages of the present disclosure will become apparent from the following detailed description.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1A:
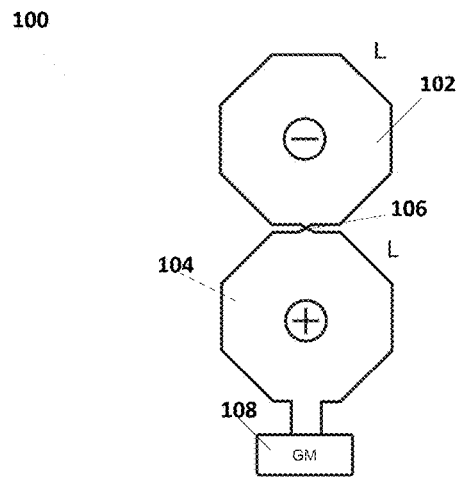
FIGS. 1A and 1B illustrate conventional figure '8' inductor topologies.

FIG. 1 illustrates a conventional passive twisted figure '8' inductor configuration 100. As illustrated in FIG. 1A, configuration 100 includes a first loop 104 and a second loop 102 separated by a twist 106. First loop 104 is coupled to a generator 108, which provides current through both first loop 104 and second loop 102. Consequently, first loop 104 and second loop 102 generate magnetic fields of different polarity. Further, since first loop 104 and second loop 102 can have substantially the same area, the magnetic fields generated by them can be substantially equal and opposite and therefore beyond the perimeter of the inductor the magnetic fields will cancel each other resulting in reduced parasitic coupling. In particular, as illustrated in FIG. 1, current produced by generator 108 flows in a first direction in first loop 104 and in a second direction opposite of the first direction in second loop 102. First loop 104 and second loop 102 are formed with the same wires or conductors, where a twist 106 is formed between them. Consequently, in current may flow counter-clockwise around loop 104 to generate a magnetic field with a positive polarity while current may flow in a clockwise direction around loop 102 to generate a magnetic field with a negative polarity.

Figure 1B:
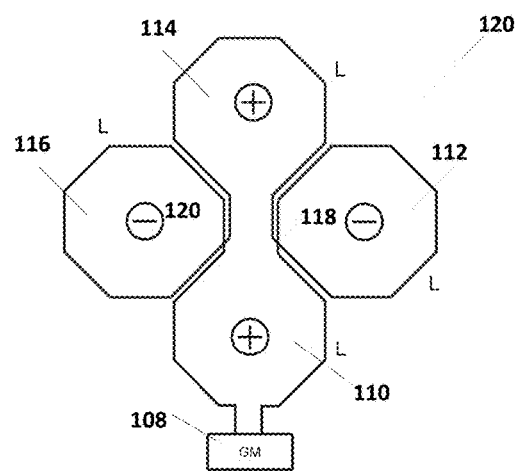

FIG. 1B illustrates a second configuration, configuration 120, illustrating another conventional passive figure '8' inductor. As illustrated in FIG. 1B, configuration 120 is again driven by a generator 108, which supplies current throughout configuration 120. As shown in FIG. 1B, configuration 120 is arranged with a first lobe 110, a second lobe 114, a first loop 112, and a second loop 116. A first twist 118 separates first lobe 110 and second lobe 114 and forms a first loop 112. A second twist 120 separates first lobe 110 and second lobe 114 and forms the second loop 116. As illustrated, the current generated by generator 108 flows in a first direction around first lobe 110 and second lobe 114 and in a second direction opposite the first direction in first loop 112 and second loop 116. As such, the magnetic fields generated by first lobe 110 and second lobe 114 is opposite that of the magnetic fields generated by first loop 112 and second loop 116. Further, the area of first lobe 110 and second lobe 114 can be substantially equal to the area of first loop 112 and second loop 116. Consequently, the magnetic field generated by first lobe 110 and second lobe 114 and the magnetic field generated by first loop 112 and second loop 116 can cancel.

As discussed above, conventional inductors, as illustrated in FIGS. 1A and 1B, include a winding scheme that provides sections of twisted pair or a twisted quad of single inductors connected to a generator. Conventional inductors are limited, however, to the quad configuration and dual core configuration illustrated in FIGS. 1A and 1B by the practicality of implementing the inductors. By connecting these inductors in this manner, as illustrated in FIGS. 1A and 1B, the magnetic fields generated by each single inductor cancel each other. However, the electrical performance of these structures suffers significantly, deteriorating the VCO phase noise performance of the resulting inductor.

Figure 2A:
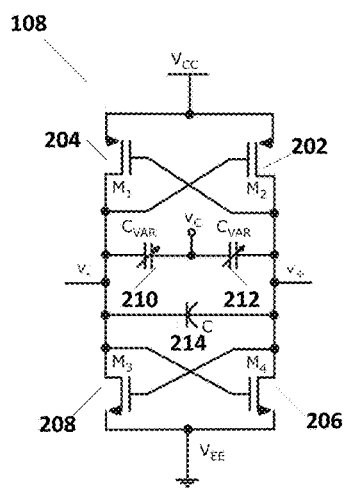
FIG. 2A illustrates an example of a generator that can be used to drive inductors in figure '8' topologies.

FIG. 2A illustrates an example of a generator 108 that can provide current to the conductors of inductors 100 as illustrated in FIG. 1A or inductor 120 as illustrated in FIG. 1B. As illustrated in FIG. 2A, generator 108 can be a negative resistance generator formed of cross-coupled transistors 202 and 204 in series with cross-coupled transistors 206 and 208 coupled between a power source $V_{CC}$ and ground $V_{EE}$. In particular, the gate of transistors 202 and 206 is coupled to the coupled drains of transistors 204 and 208 while the gates of transistors 204 and 208 are coupled to the coupled drains of transistors 202 and 206. Further, the coupled drains of transistors 204 and 208 form a first output (labeled $V_-$) while the coupled drains of transistors 202 and 206 form a second output (labeled $V_+$). Further, variable capacitors 210 and 212 are coupled in series between the drains of transistors 202 and 204 (and the drains of transistors 206 and 208). An input voltage $V_C$ is provided at a node between the series coupled variable capacitors 210 and 212. A second capacitor 214 may further be provided between the drains of transistors 206 and 208 in parallel with the series coupled variable capacitors 210 and 212. A voltage is provided between the first output and the second output in response to a voltage provided at the input voltage $V_C$.

Figure 2B:
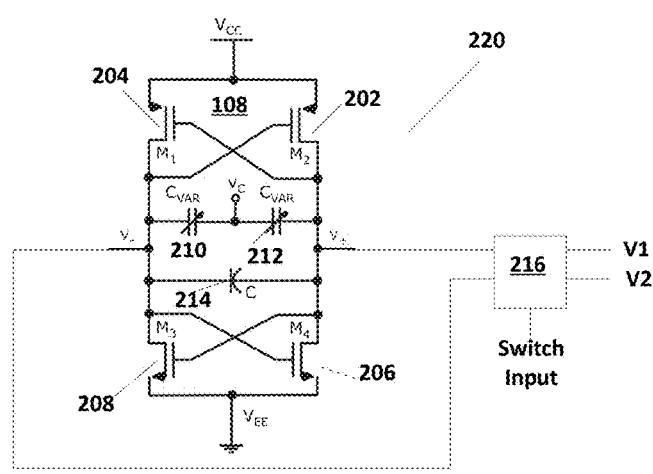
FIG. 2B illustrates an example of a generator with a switch according to some embodiments of the present invention.

FIG. 2B illustrates a variation of generator 108 illustrated in FIG. 2A. As illustrated in FIG. 2B, the output signals V− and V+ are input to a switch 216. In response to a switch input signal, the output signals V− and V+ are coupled to output signals V1 and V2. In that fashion, the output signals V1 and V2 can be selectively coupled to output signals V− and V+ in response to the switch input signal.

Figure 3A:
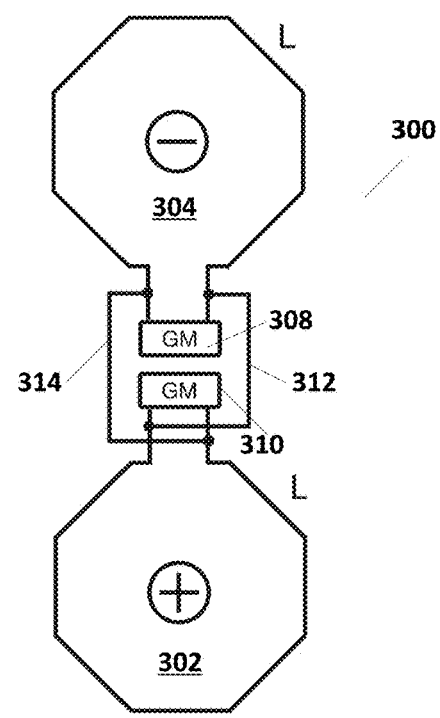
FIG. 3A illustrates an example of a figure '8' topology according to some embodiments of the present invention.

FIG. 3A illustrates an inductor according to some embodiments of the present invention. As illustrated in FIG. 3A, inductor 300 includes a first lobe 302 and a second lobe 304. First lobe 302 is coupled to be driven by generator 308 and second lobe 304 is coupled to be driven by generator 310. Generators 308 and 310 can each be the same as generator 108 as illustrated in FIG. 2A. In some embodiments, generator 308 and 310 can each be the same as generator 220 as illustrated in FIG. 2B. As shown in FIG. 2B, generator 220 includes generator 108 with outputs V− and V+ coupled to a switch 216. Switch 216 can be an FET based switch that selectively couples outputs V− and V+ to outputs V1 and V2 so that the polarity of generator 108 can be switched. Switch 216 can be controlled by a switch input signal.

As is further illustrated in FIG. 3A, lobes 302 and 304 are cross coupled with interconnects 312 and 314. Interconnects 312 and 314 can be hardwired as indicated in FIG. 3. As such, the polarity of the magnetic field generated by lobe 302 is opposite that generated by lobe 304. Further, if generators 308 and 310 are switched as indicated with generator 220 illustrated in FIG. 2B, then inductor 300 can be controlled to control the polarity of the magnetic fields generated in lobes 302 and 304, where the polarity in lobe 302 is opposite that of lobe 304. Consequently, FIG. 3 illustrates an active dual core inductor that can be used for RF VCO topologies while maintaining a magnetic field arrangement that is substantially equal and opposite in each lobe. Such an arrangement achieves better phase noise performance (~3 dBc) than the passive dual core inductor topology illustrated in FIGS. 1A and 1B and maintaining the same immunity to parasitic coupling. The inductors formed by lobes 302 and 304 can include any number of turns (for example 3 or more turns) and can be formed in any shape. Lobes 302 and 304 generate canceling magnetic fields if lobes 302 and 304 are symmetrically shaped and have equal areas.

Figure 3B:
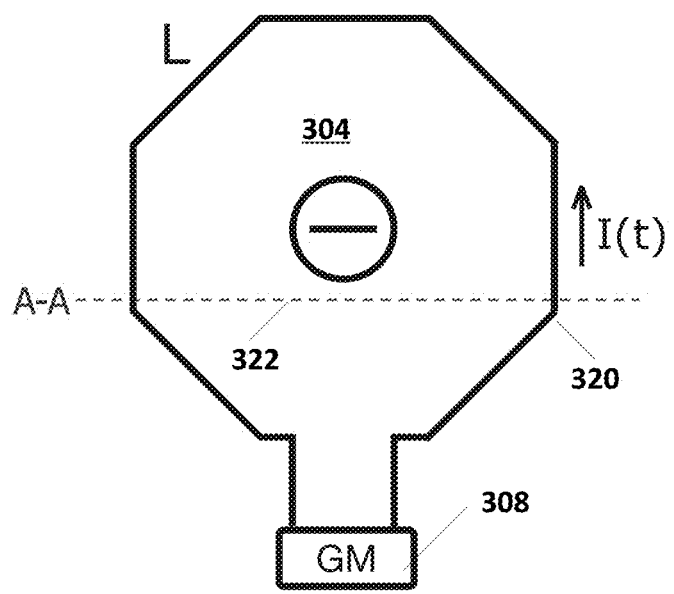
FIGS. 3B and 3C further detail topology of the figure '8' configuration illustrated in FIG. 3A.
Figure 3C:
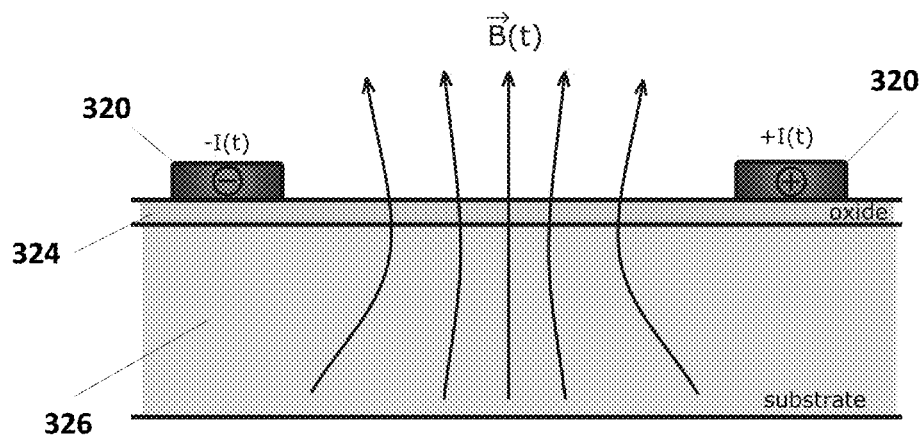

FIG. 3B illustrates lobe 304. As illustrated, lobe 304 includes loops of wiring 320. A cut 322 (labeled A-A) is illustrated in FIG. 3B. As illustrated, the polarity of lobe 304 is determined by the direction of current I(t), which in this illustration is shown as a counter-clockwise direction around lobe 304. FIG. 3C illustrates the cross section of lobe 304 along the cut 322, A-A, illustrate in FIG. 3B. As illustrated in FIG. 3C, wiring 320 can be mounted on an insulating oxide 324 which is deposited over a substrate 326. As is further illustrated in FIG. 3C, and magnetic field B(t) is generated by current I(t) flowing through the loop formed by wire 320.

Figure 4:
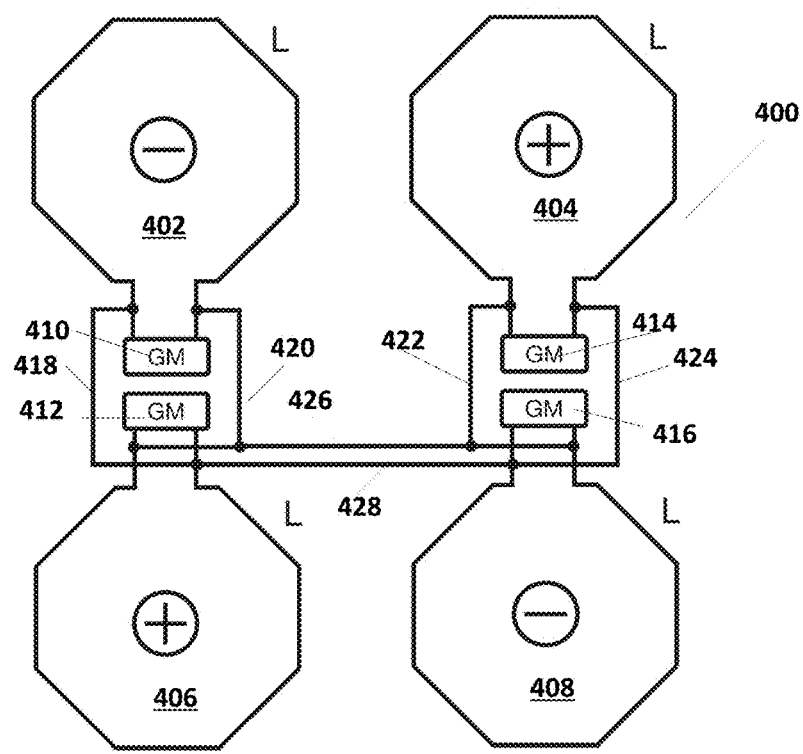
FIG. 4 illustrates another example of a figure '8' topology according to some embodiments of the present invention.

FIG. 4 illustrates an active quad core inductor 400 according to some embodiments. Inductor 400 is the active counterpart to passive quad core inductor topology illustrated in FIG. 1B. As illustrated in FIG. 4, inductor 400 includes lobes 402, 404, 406, and 408 arranged in a symmetrical quadrature arrangement. As is further illustrated, lobe 402 is coupled to be driven by generator 410. Lobe 404 is coupled to be driven by generator 414. Lobe 406 is coupled to be driven by generator 412. Lobe 408 is coupled to be driven by generator 416. Furthermore, lobes 402 and 406 are cross-coupled with interconnects 418 and 420, respectively. Lobes 404 and 408 are cross-coupled with interconnects 422 and 424. Furthermore, interconnects 426 and 428 couple lobes 402 and 406 with lobes 404 and 408. With the observed interconnections between lobes 402, 404, 406, and 408, lobes 404 and 406 generate a magnetic field opposite in polarity from lobes 402 and 408. Consequently, in the quad arrangement of lobes 402, 404, 406, and 408, with symmetrical lobes, the magnetic fields generated are canceled beyond the perimeter of inductor structure.

As discussed above, actively driving lobes 402, 404, 406, and 408 in the quad arrangement, along with the appropriate cross-connects between lobes 402, 404, 406, and 408, results in better phase noise performance (in some embodiments around 6 dBc) than that provided in passive quad topology inductor 120 illustrated in FIG. 1B, while maintaining the same immunity to parasitic coupling. Again, lobes 402, 404, 406, and 408 can be formed with multiple turns and can be of any shape. In some embodiments, for example, multiple turns can be formed symmetrically with a central tap.

As discussed above, inductor 300, illustrated in FIG. 3, and inductor 400, illustrated in FIG. 4, maintain the same magnetic field arrangements as achieved with conventional inductor 100, illustrated in FIG. 1A, and inductor 120, illustrated in FIG. 1B, respectively. However, inductors 300 and 400 achieve better phase noise performance than achieved in conventional inductors 100 and 120. Additionally, inductors according to embodiments are not limited to quad configurations utilizing single turn inductors. Instead inductors according to some embodiments can be configured into almost any configuration, for example a matrix configuration, using any inductor shape, and any number of turns, without electrical parameter degradation as its counterpart utilizing only passive elements and maintaining similar immunity to parasitic coupling.

As such, an inductor according to some embodiments, can be formed by a number of interconnected lobes where each lobe is driven by a separate generator. In some embodiments, there are an even number of symmetrically arranged lobes and the polarity of magnetic field produced by each lobe is arranged to cancel magnetic fields produced by other lobes. In some embodiments, a magnetic field can be designed to be produced by the collection of arranged lobes. The relative polarities of magnetic fields produced by the lobes in the inductor can be arranged by interconnects that connect the outputs of the generators for each lobe.

Figure 5A:
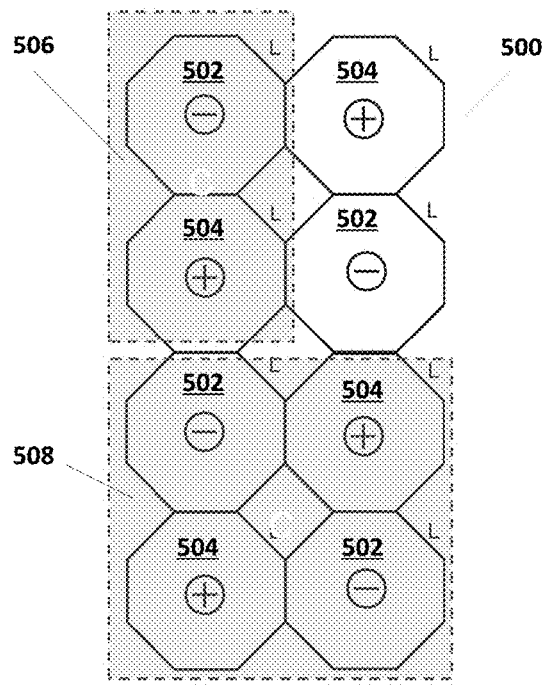
FIGS. 5A and 5B illustrate examples of a 2×4 topology according to some embodiments of the present invention.
Figure 5B:
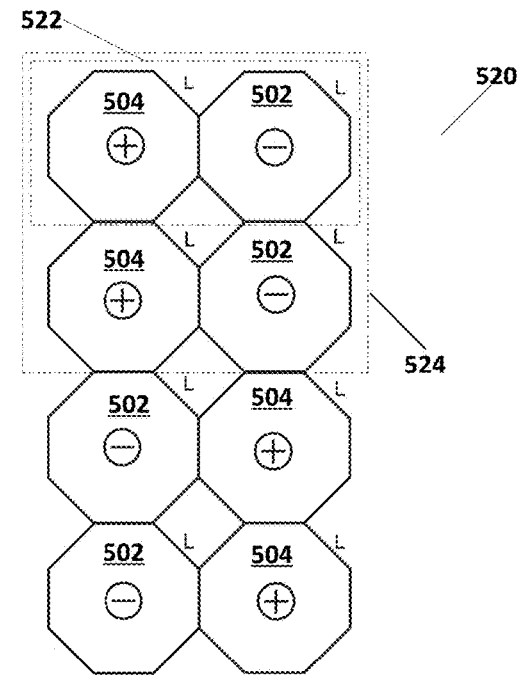

FIGS. 5A and 5B illustrate examples of inductors according to some embodiments arranged in a 4×2 configuration. FIG. 5A illustrates an inductor 500 that includes lobes 502, which are driven to produce a magnetic field with a negative polarity, and lobes 504, which are driven to produce a magnetic field with a positive polarity, arranged in pairs such that polarity of the magnetic field for the closest neighbors of each lobe are opposite that of the lobe. For example, each lobe 502 is closely neighbored by two or more lobes 504 with opposite polarity, and each lobe 504 is closely neighbored by two or more lobes 502 having opposite polarity.

Furthermore, the configuration of FIG. 5A can be formed in multiple ways. For example, inductor 500 can be formed by arranging four of inductor configurations 506. Inductor configuration 506 can be inductors 300 as illustrated in FIG. 3 with appropriate interconnects between inductors 300. Alternatively, inductor 500 can be formed by arranging two of inductor configurations 508. Inductor configuration 508 can be inductor 400 as illustrated in FIG. 4 with appropriate interconnects between the pair of inductors 400 provided to form inductor 500.

FIG. 5B illustrates another configuration according to some embodiments. Inductor 520 provides another 2×4 arrangement with lobes 502 and 504. As indicated above, lobes 502 generate a magnetic field with a first polarity (here labeled a negative polarity) while lobes 504 generate a magnetic field with a second polarity (here labeled a positive polarity) that is opposite from the first polarity. However, as is illustrated in FIG. 5B, each lobe 504 has a neighboring lobe 504 and a neighboring lobe 502. Similarly, each lobe 502 has a neighboring lobe 502 and a neighboring lobe 504. In some embodiments, lobes 502 and 504 can be paired in the configuration of inductor 300 illustrated in FIG. 3. An example of that pairing is indicated as inductor section 524, which may represent an arranged pair of inductors 300 with appropriate interconnects throughout inductor section 520. However, in some embodiments, pairs of lobes can be provided that can have the same polarity. In FIG. 5B, section 524 illustrates a symmetric portion of inductor 520 with both positive lobes 504 and negative lobes 502.

Figure 7:
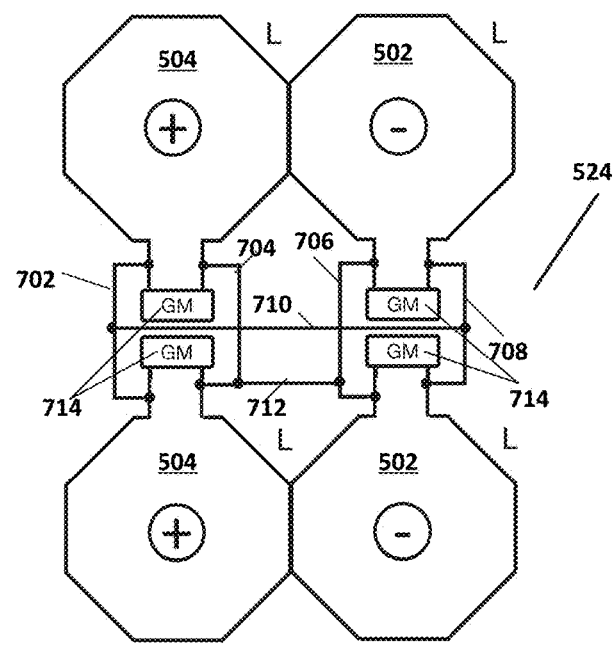
FIG. 7 illustrates interconnects in a section of the topology illustrated in FIG. 5B.

FIG. 7 illustrates an example configuration of section 524 of inductor 520 illustrated in FIG. 5B. As illustrated in FIG. 5B and FIG. 7, section 524 includes lobes 504 having a first polarity and lobes 502 having a second polarity opposite the first polarity. As is further illustrated in FIG. 7, the two lobes 504 are coupled with interconnects 702 and 704. The two lobes 502 are coupled with interconnects 706 and 708. Each of lobes 504 and 502 are coupled to individual generators 714. As discussed above, generators 714 can be, for example, generator 108 as illustrated in FIG. 2A or generator 220 as illustrated in FIG. 2B. As is further illustrated in FIG. 7, lobes 504 and lobes 502 are cross-coupled with interconnects 710 and 712 in order to maintain the opposite polarities of lobes 504 and 502.

Figure 6:
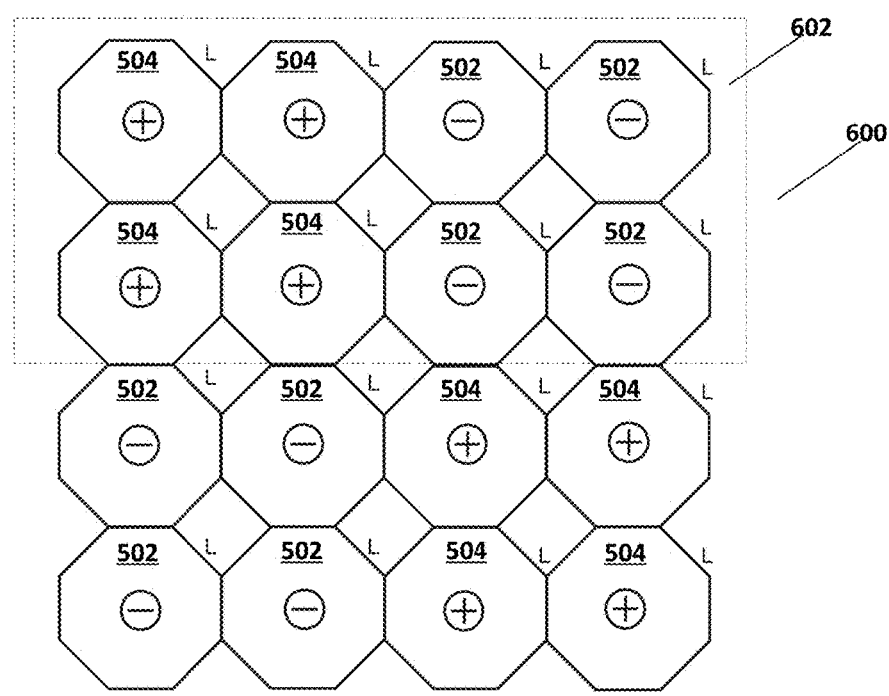
FIG. 6 illustrates an example of a 4×4 topology according to some embodiments of the present invention.
Figure 8:
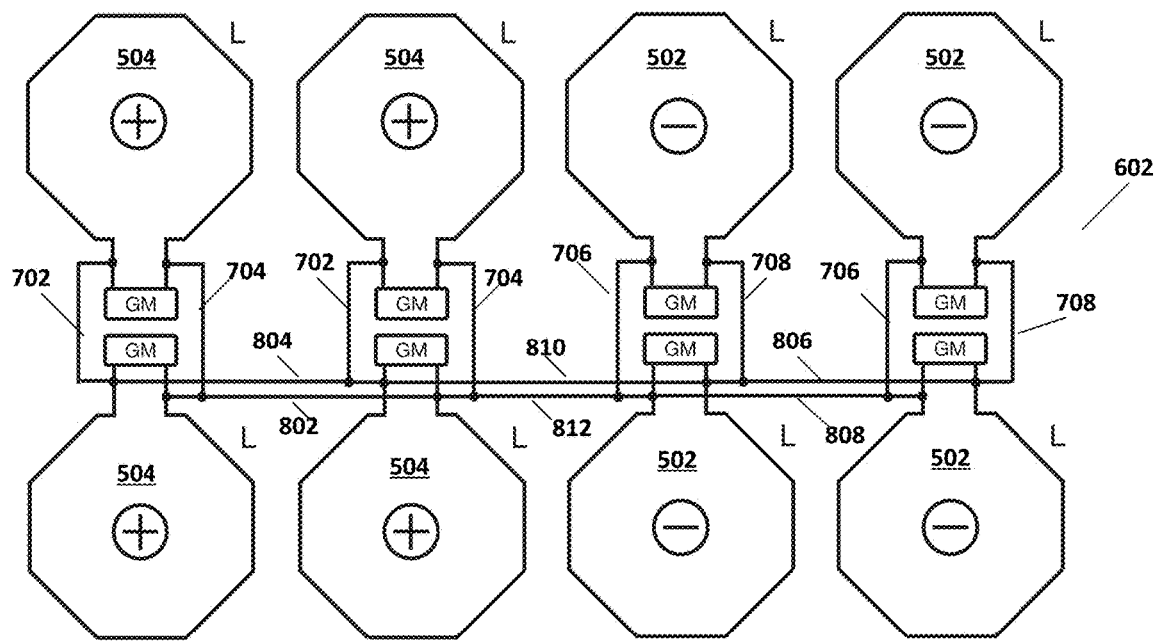
FIG. 8 illustrates interconnects in a section of the topology illustrated in FIG. 6.

FIG. 6 illustrates another example configuration of an inductor 600. Inductor 600 represents a 4×4 configuration. Further, in the example illustrated in FIG. 6, inductor 600 includes 2×2 blocks of lobes 504 with a first polarity with neighboring 2×2 blocks of lobes 502 with a second polarity opposite the first polarity. FIG. 8 further illustrates a section 602 of inductor 602.

As illustrated in FIG. 8, section 602 includes a 2×2 block of lobes 504 neighboring a 2×2 block of lobes 502. Interconnects 702 and 704 couple pairs of lobes 504 so that the first polarity is maintained between them. Interconnects 706 and 708 couple pairs of lobes 502 so that the second polarity is maintained between them. Interconnects 802 and 804 couple interconnects 704 and 702, respectively, so that the 2×2 block of lobes 504 maintain the first polarity. Interconnects 806 and 808 couple interconnects 708 and interconnects 706, respectively, so that the 2×2 block of lobes 502 maintain the second polarity. Further, interconnects 810 and 812 cross couple the 2×2 block of lobes 504 with the 2×2 block of lobes 502 so that the first polarity and the second polarity are opposite polarities.

In practice, any combination of lobes can be provided in order to provide for any magnetic field configuration. As discussed above, the lobes can be of any shape. In some embodiments, symmetrical configurations of opposite polarity lobes can be provided such that the magnetic field is canceled resulting in further enhancing the immunity to parasitic coupling and improving the phase noise performance by $10*\log(n)$ where n is a number of active GM sections. Consequently, any pattern of n×m lobes having any shape can be formed. Patterns that are symmetrically formed and arranged to form magnetic fields with paired opposites of polarities may result in on overall canceling of the magnetic field.

The above detailed description is provided to illustrate specific embodiments of the present invention and is not intended to be limiting. Numerous variations and modifications within the scope of the present invention are possible. The present invention is set forth in the following claims.

What is claimed is:

1. An inductor, comprising:
   a plurality of lobes arranged relative to one another;
   a plurality of generators, each of the generators coupled across a corresponding one of the plurality of lobes, wherein each generator of the plurality of generators includes a switch that controls a polarity of output signals; and
   cross-coupling interconnects configured to cross-couple the plurality of lobes such that magnetic fields generated in each of the lobes has an arranged relative polarity with the other lobes,
   wherein the switch of each of the plurality of generators is configured to set the magnetic fields generated in each of the lobes according to the arranged relative polarity.

2. The inductor of claim 1, wherein the arranged polarity of each of the plurality of lobes is such that the total magnetic field of the inductor is canceled.

3. The inductor of claim 1, wherein the plurality of lobes includes a pair of lobes arranged to provide magnetic fields with opposite polarities.

4. The inductor of claim 1, wherein the plurality of lobes includes a quadrature of lobes arranged in pairs that provide magnetic fields with opposite polarities.

5. The inductor of claim 1, wherein the plurality of lobes are arranged in a symmetrical geometric pattern.

6. The inductor of claim 5, wherein the symmetrical geometric pattern includes a 2×4 arrangement of lobes.

7. The inductor of claim 5, wherein the symmetrical geometric pattern includes a 4×4 arrangement of lobes.

8. The inductor of claim 1, wherein the plurality of lobes are arranged in a n×m pattern of lobes.

9. The inductor of claim 1, wherein each generator of the plurality of generators are negative resistance generators.

10. A method of forming an inductor, comprising:
providing an arrangement of lobes, each of the lobes in the arrangement of lobes driven by a switchable generator; and
cross-coupling the arrangement of lobes such that, when currents are provided by each generator in the arrangement of lobes, each lobe in the arrangement of lobes produces a magnetic field with a defined polarity relative to the arrangement of lobes,
wherein the switchable generator for each of the lobes is switched to drive the lobe to generate the magnetic field in accordance with the defined polarity.

11. The method of claim 10, wherein the arrangement of lobes is a symmetric arrangement.

12. The method of claim 11, wherein the defined polarity of each of lobes is arranged such that the magnetic field for the arrangement of lobes is canceled.

13. The method of claim 10, wherein the arrangement of lobes includes a pair of lobes arranged to provide magnetic fields with opposite polarities.

14. The method of claim 10, wherein the arrangement of lobes includes a quadrature of lobes arranged in pairs with defined polarities being opposite polarities.

15. The method of claim 11, wherein the symmetrical arrangement includes a 2×4 arrangement of lobes.

16. The method of claim 11, wherein the symmetrical arrangement includes a 4×4 arrangement of lobes.

17. The method of claim 10, wherein the arrangement of lobes include lobes are arranged in a n×m pattern of lobes.

18. The method of claim 10, wherein each generator of the arrangement of lobes are negative resistance generators.

* * * * *